United States Patent
Suzuki et al.

(10) Patent No.: US 6,731,518 B2
(45) Date of Patent: May 4, 2004

(54) RADIO-FREQUENCY APPARATUS

(75) Inventors: Kenji Suzuki, Fukaya (JP); Shinzo Minomo, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 10/092,718

(22) Filed: Mar. 8, 2002

(65) Prior Publication Data
US 2002/0126466 A1 Sep. 12, 2002

(30) Foreign Application Priority Data
Mar. 9, 2001 (JP) ........................... 2001-067169

(51) Int. Cl.[7] .................................. H05K 9/00
(52) U.S. Cl. ................ 361/818; 361/753; 361/800
(58) Field of Search ..................... 361/816, 818, 361/759, 800, 801, 752, 753, 802, 824; 174/35 R; 70/208; 403/24, 409.1

(56) References Cited

U.S. PATENT DOCUMENTS

| 4,404,617 A | * | 9/1983 | Ohyama et al. ............ 361/818 |
| 4,689,825 A | * | 8/1987 | Geiger et al. ............... 455/347 |
| 4,697,044 A | * | 9/1987 | Ishikawa .................. 174/35 R |
| 5,913,173 A | * | 6/1999 | Ohwaki et al. ............. 455/550 |
| 6,373,711 B2 | * | 4/2002 | Yamauchi et al. .......... 361/752 |
| 6,388,189 B1 | * | 5/2002 | Onoue ..................... 174/35 R |

FOREIGN PATENT DOCUMENTS

JP 2861873 12/1998

\* cited by examiner

*Primary Examiner*—David Martin
*Assistant Examiner*—Thanh S. Phan
(74) *Attorney, Agent, or Firm*—Pillsbury Winthrop LLP

(57) ABSTRACT

A radio-frequency apparatus is constructed such that peripheral edge portions of a printed circuit board provided with a radio-frequency circuit is enclosed by a frame-shaped shield case. Both openings of the shield case are closed by shield covers. The apparatus has a holding mechanism for holding the shield cover in a state that a predetermined distance is kept between the shield cover and terminal edges of the shield case.

13 Claims, 4 Drawing Sheets

RADIO-FREQUENCY APPARATUS

CROSS-REFERENCE TO RELATED APPLICATIONS

This application is based upon and claims the benefit of priority from the prior Japanese Patent Application No. 2001-067169, filed Mar. 9, 2001, the entire contents of which are incorporated herein by reference.

BACKGROUND OF THE INVENTION

1. Field of the Invention

The present invention relates generally to a radio-frequency apparatus for use in a CS (Communication Satellite) digital broadcast receiving apparatus, etc., and more particularly to an improvement of a shield mechanism for the radio-frequency apparatus.

2. Description of the Related Art

As is well known, the radio-frequency apparatus is constructed such that peripheral edge portions of a printed circuit board, on which a radio-frequency circuit is formed, is surrounded by a frame-shaped shield case. Both openings of the shield case are closed by shield covers.

In this case, each shield cover is coupled to the shield case by engaging hook-shaped resilient engaging portions formed at peripheral edges of the shield cover with projection portions formed on an outer peripheral surface of the shield case.

The printed circuit board is partitioned by a shield board into areas associated with respective circuit blocks provided on the printed circuit board. The shield board is supported on the shield case.

Each shield cover is provided with a resilient contact portion. When the shield cover is coupled to the shield case, the resilient contact portion is put in pressure-contact with the shield case or shield board, thus effecting grounding.

With this shield structure, however, a gap may be created between a terminal edge portion of the shield case and a flat surface portion of the associated shield cover, owing to dimensional errors of the shield case and shield covers.

As a result, contact between the shield case and shield covers becomes loose. Due to vibration, etc., the terminal edge portions of the shield case and the surface portions of shield covers may repeatedly come into and out of contact with each other.

The presence of such loose contact portions leads to an instantaneous change of a ground path due to vibration, noise, etc. Consequently, the oscillation frequency, etc. of, for example, a local oscillation circuit formed on the printed circuit board may vary. This variation may cause block noise in the case of digital broadcast reception.

In order to solve this problem, techniques, as disclosed in Japanese Patent No. 2,861,873, have been developed. In such techniques, however, the number of portions, at which the shield case and shield covers are opposed with a small distance, is reduced to decrease the number of locations of loose contact. These techniques provide no fundamental solution to the problem.

BRIEF SUMMARY OF THE INVENTION

The present invention has been made in consideration of the above circumstances, and the object of the invention is to provide a radio-frequency apparatus capable of preventing loose contact between shield members, thus preventing a radio-frequency circuit from being adversely affected.

According to one aspect of the present invention, there is provided a radio-frequency apparatus comprising: a shield case in which a printed circuit board provided with a radio-frequency circuit is attached; a shield cover attached to the shield case such that the shield cover covers a predetermined area of the printed circuit board; and a holding mechanism configured to hold the shield cover on the shield case in a state that a predetermined distance is kept between the shield cover and the shield case, with no contact between the shield cover and terminal edges of the shield case.

Therefore, loose contact between the shield cover and the shield case can be prevented and an adverse effect on the radio-frequency circuit can also be prevented wherein the shield cover is attached to the shield case in a state that a predetermined distance is kept between the shield cover and the shield case, with no contact between the shield cover and terminal edges of the shield case.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
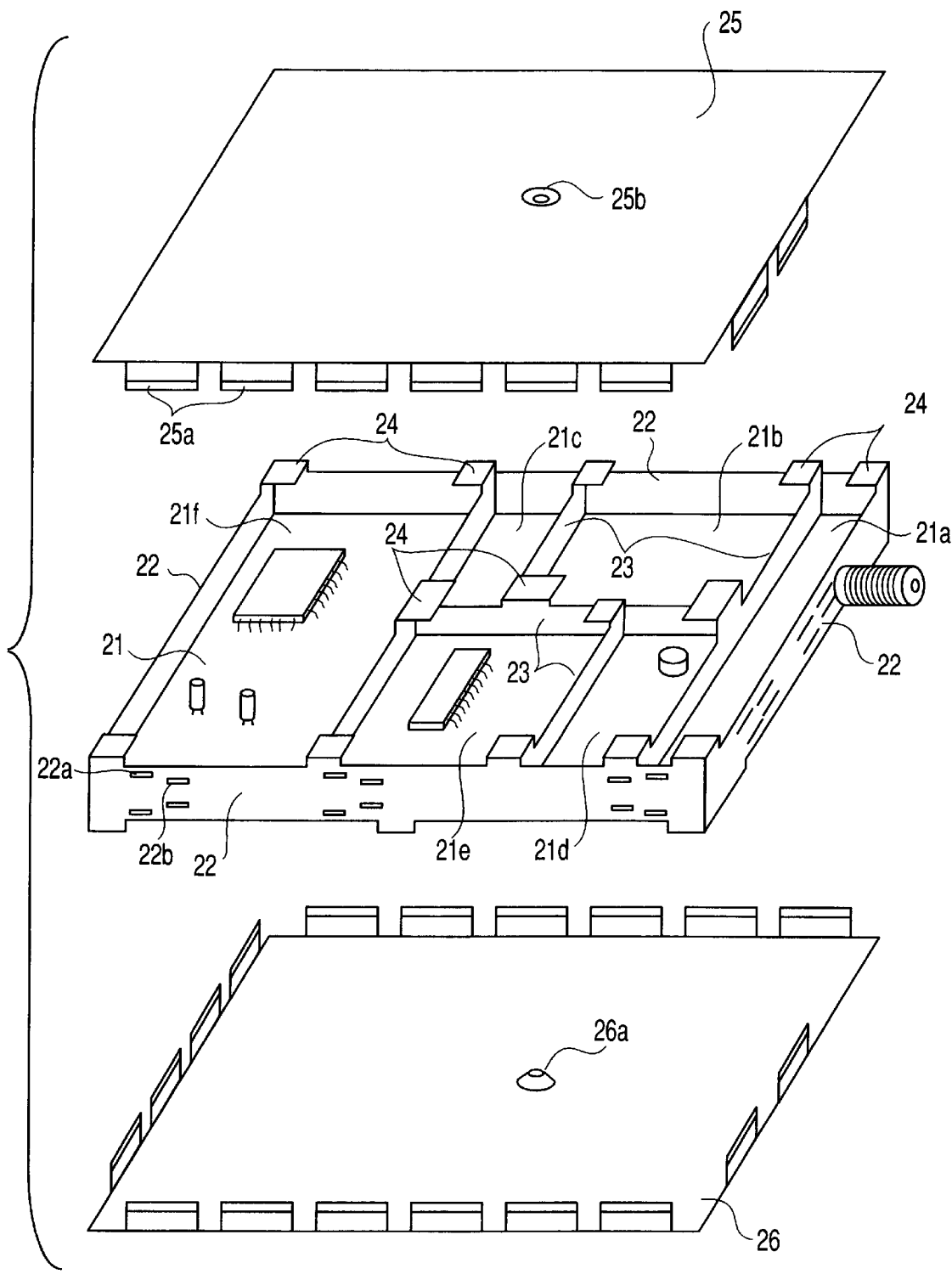
FIG. 1 is an exploded perspective view illustrating an embodiment of a radio-frequency apparatus according to the present invention.

An embodiment of the present invention will now be described in detail with reference to the accompanying drawings. In FIG. 1, reference numeral 21 denotes a printed circuit board. A radio-frequency circuit for CS digital broadcast reception is formed on the printed circuit board 21.

The components of the radio-frequency circuit are mounted on one surface (the upper surface in FIG. 1) of printed circuit board 21. Conductor patterns including a signal pattern and a ground pattern are formed on the other surface (the lower surface in FIG. 1) of the printed circuit board 21.

The radio-frequency circuit comprises circuit blocks such as an input circuit 21a, an AGC (Automatic Gain Control) circuit & RF (Radio Frequency) amplifier circuit 21b, a PLL (Phase Locked Loop) tuner circuit 21c, an I/Q LPF (Low Pass Filter) circuit 21d, an I/Q detection circuit 21e and a QPSK (Quadrature Phase Shift Keying) demodulation circuit 21f.

The printed circuit board 21 is attached within a frame-shaped shield case 22. In other words, the peripheral edge portions of the printed circuit board 21 are surrounded by the frame-shaped shield case 22. The printed circuit board 21 is partitioned by a shield board 23 into areas associated with the respective circuit blocks 21a to 21f formed on the printed circuit board 21.

The shield board 23 is supported on the shield case 22. In addition, a plurality of contact portions 24 are formed at four the corners of the shield case 22, and at substantially T-shaped abutment portions between the shield case 22 and shield board 23 or between shield boards 23.

The printed circuit board 21 is shielded such that both surfaces thereof, which are not surrounded by the shield case 22 and shield board 23, are closed by shield covers 25 and 26. The shield covers 25 and 26 are coupled to the shield case 22.

Figure 2:
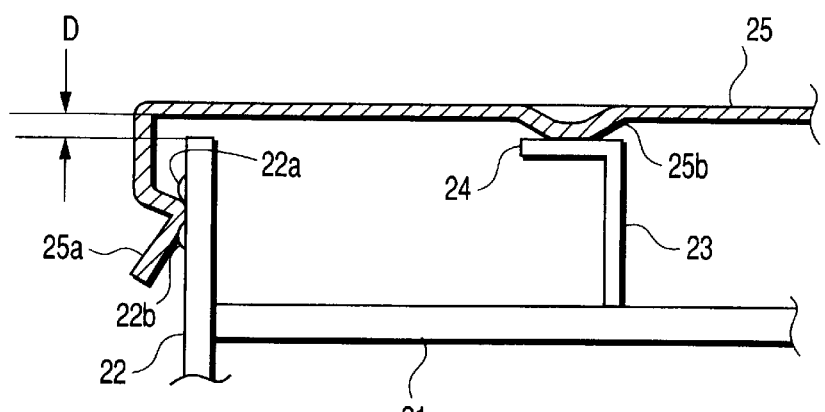
FIG. 2 is a cross-sectional side view illustrating the relationship between a resilient engaging portion, a removal-prevention projection, and a sink-prevention projection in the embodiment.

FIG. 2 shows a structure for coupling the shield case 22 and shield cover 25. A structure for coupling the shield case 22 and shield cover 26 is the same, and so a description thereof is omitted.

A removal-prevention projection 22a, which prevents the cover from being removed from the case 22, and a sink-prevention projection 22b, which prevents the cover from sinking down, are formed at predetermined locations on the outer peripheral surface of the shield case 22. A peripheral edge portion of the shield cover 25 is provided with a hook-shaped resilient engaging portion 25a that is put in pressure-contact with the outer peripheral surface of the shield case 22.

When the shield cover 25 is to be coupled to the shield case 22, the resilient engaging portion 25a moves beyond the removal-prevention projection 22a and is engaged between the removal-prevention projection 22a and sink-prevention projection 22b. In this state, the shield cover 25 is coupled to the shield case 22.

In this case, a predetermined distance D is kept between a terminal edge of the shield case 22 and a flat surface portion of the opposing shield cover 25. The distance D is so determined that the terminal edge of the shield case 22 and the shield cover 25 may not come into contact with each other due to vibration, etc.

According to the above-described embodiment, the removal-prevention projection 22a and sink-prevention projection 22b are formed on the shield case 22, and the resilient engaging portion 25a formed on the shield cover 25 is engaged between both projections 22a and 22b.

Accordingly, removal or sinking of the shield cover 25 relative to the shield case 22 is prevented. Therefore, the terminal edge of the shield case 22 and the shield cover 25 are stably held in the state in which the distance D, which prevents mutual contact, is kept. Thus, a non-contact state can always be maintained.

With the simple structure, contact between the shield case 22 and shield cover 25 can be prevented, and an adverse effect on the radio-frequency circuit can be prevented. Thereby, it is possible to prevent loose contact, which causes repeated contact and non-contact between the shield case and shield cover.

A propping projection 25b is formed at a central portion of the flat surface of the shield cover 25, which corresponds in position to one of the contact portions 24. In the state in which the shield cover 25 is coupled to the shield case 22, a top portion of the propping projection 25b is put in pressure-contact with the contact portion 24. In this case, the height of the propping projection is set such that the central portion of the shield cover 25 is raised in a curved shape.

Thereby, good electrical contact is established between the contact portion 24 and shield cover 25, and the distance D between the shield case 22 and shield cover 25 is kept more stably.

Figure 3A:
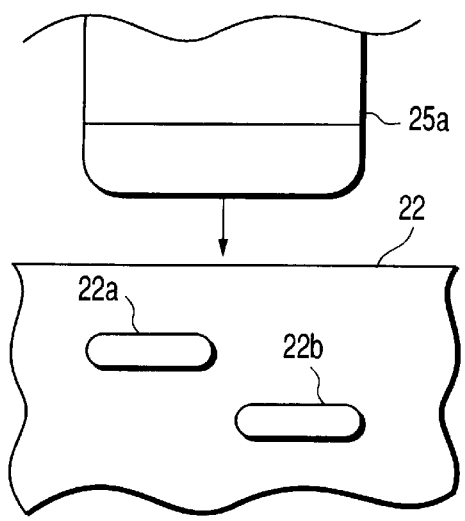
FIGS. 3A and 3B are side views illustrating the positional relationship between the removal-prevention projections and sink-prevention projection in the embodiment.

As is shown in FIG. 3A, the removal-prevention projection 22a and sink-prevention projection 22b formed on the shield case 22 are arranged in a staggered fashion in a direction of coupling (indicated by an arrow in FIG. 3A) of the resilient engaging portion 25a.

Thereby, this structure is advantageous in molding when a mold for forming the shield case 22 is fabricated. Moreover, when solder dipping is performed for the printed circuit board 21 in the state in which the shied case 22 is attached to the printed circuit board 21, this structure is advantageous with respect to dropping of solder from between the projections 22a and 22b.

Figure 3B:
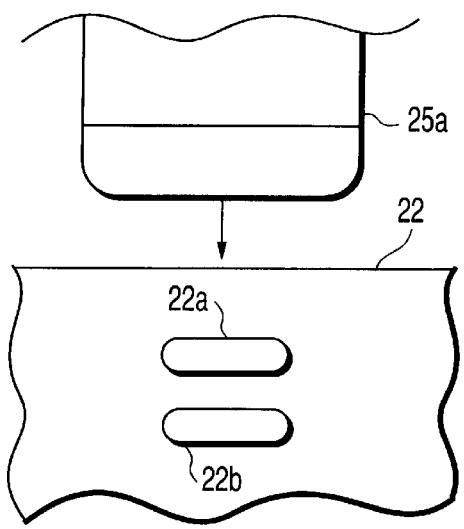

The arrangement of the removal-prevention projection 22a and sink-prevention projection 22b is not limited to the staggered one. Alternatively, other arrangements may be adopted where necessary. For example, as shown in FIG. 3B, the removal-prevention projection 22a and sink-prevention projection 22b may be aligned in the direction of coupling (indicated by an arrow in FIG. 3B) of the resilient engaging portion 25a.

Stable coupling between the case and cover can be effected if a plurality of removal-prevention projections 22a and sink-prevention projections 22b are so formed on each peripheral side surface of the shield case 22 that they are aligned in the circumferential direction of the shield case 22.

Figure 4:
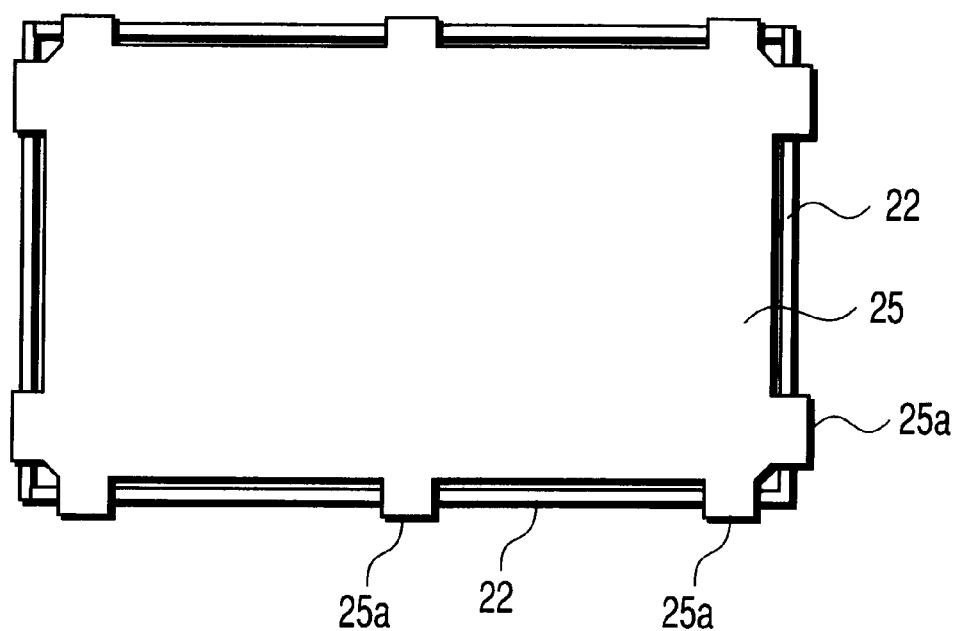
FIG. 4 is a plan view illustrating a modification of the embodiment.

FIG. 4 shows a modification of the above-described embodiment. Hook-shaped resilient engaging portions 25a are formed at corner portions and middle portions of side edges of the shield cover 25. Specifically, in FIG. 4, resilient engaging portions 25a are formed at the four corner portions of the shield case 22, and at middle portions of the longer sides in FIG. 4.

In addition, in the modification of FIG. 4, the peripheral edge portions of shield cover 25 between the resilient engaging portions 25a, which oppose the terminal edges of the shield case 22, have been removed. That is to say, in this modification, other than the resilient engaging portions 25a, there is no contact between the shield case 22 and shield cover 25.

With this structure, the area of the shield cover 25, which faces the terminal edge portions of the shield case 22, is reduced. Thus, loose contact can be prevented more effectively.

In the above embodiment, both surfaces of the printed circuit board 21 are covered with shield covers 25 and 26. However, only necessary areas of the printed circuit board 21 may be covered by the shield covers.

For example, in FIG. 1, the lower surface of the printed circuit board 21 may be entirely covered with the shield cover 26, and the upper surface thereof excluding the area of the QPSK demodulation circuit 21f may be covered with the shield cover 25.

In this case, removal-prevention projections and sink-prevention projections are formed not only to the shield case 22 but also to the shield board 23. The resilient engaging portions 25a of the shield cover 25 may be engaged between the removal-prevention projections and sink-prevention projections formed on the shield case 22 and shield board 23.

In the above-described embodiment, a propping projection 26a is additionally formed at a substantially central portion of the shield cover 26 covering that surface of the printed circuit board 21, on which the conductor patterns are formed.

The propping projection 26a may be put in contact with a ground terminal formed on the conductor pattern surface of the printed circuit board 21.

Figure 5A:
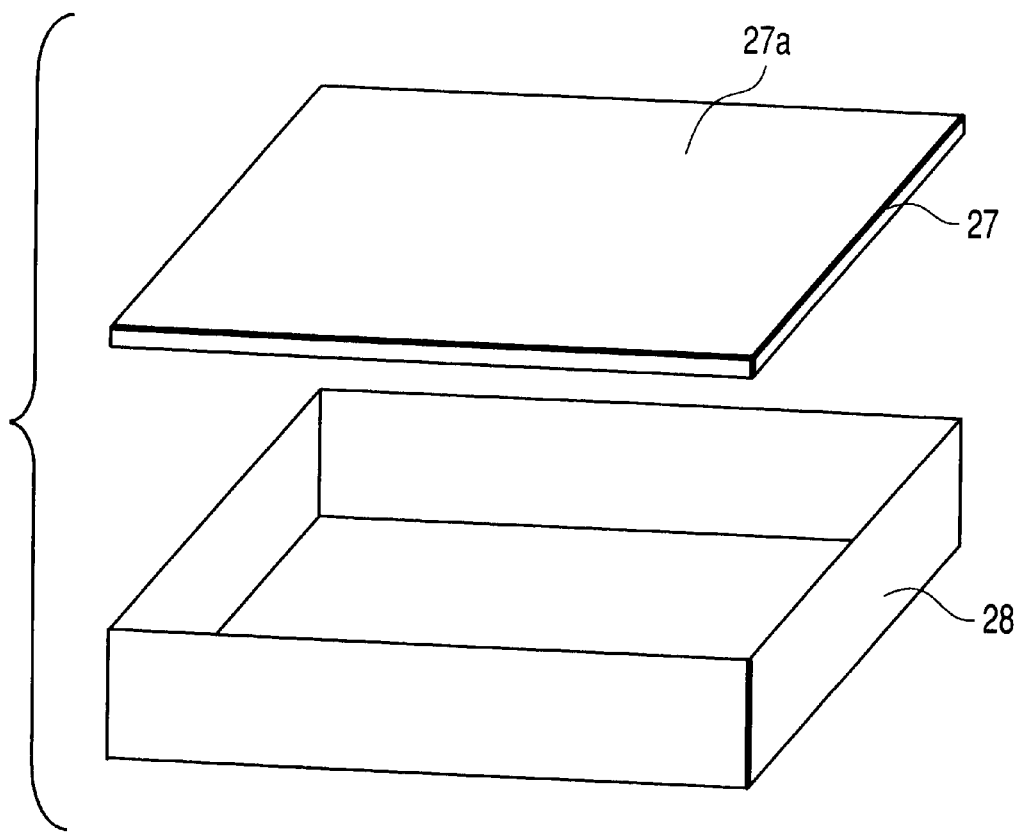
FIGS. 5A and 5B are perspective views for describing another embodiment of the radio-frequency apparatus according to this invention.
Figure 5B:
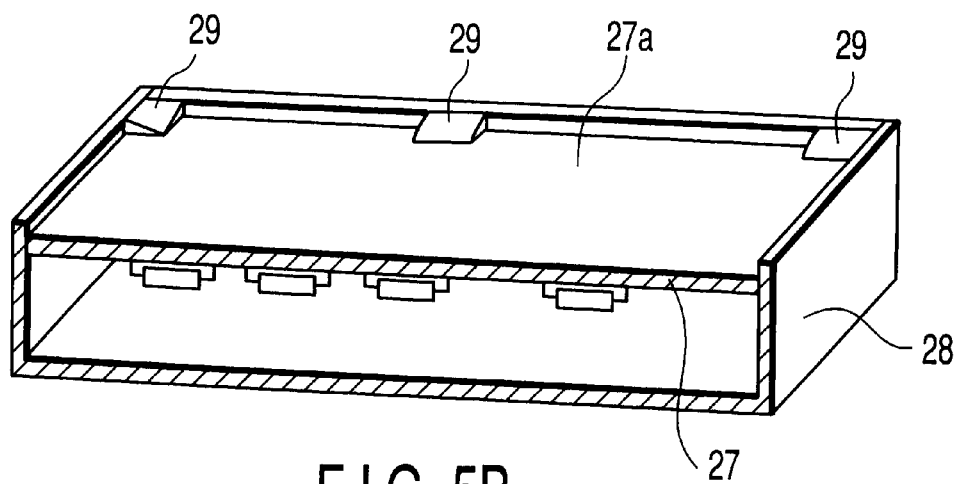

FIGS. 5A and 5B show another embodiment of the invention. In FIG. 5A, reference numeral 27 denotes a printed circuit board. The printed circuit board 27 has a multi-layer structure comprising, e.g. three or more layers. Circuit components (not shown) are provided on the lower surface (in FIGS. 5A and 5B) of the printed circuit board 27. A ground pattern 27a is formed on almost the entire area of the upper surface of the board 27.

That surface of the printed circuit board 27, which is provided with the circuit components, is covered by a substantially box-shaped shield case 28. As is shown in FIG. 5B, the ground pattern 27a of printed circuit board 27 and the shield case 28 are coupled by solder portions 29.

Figure 6:
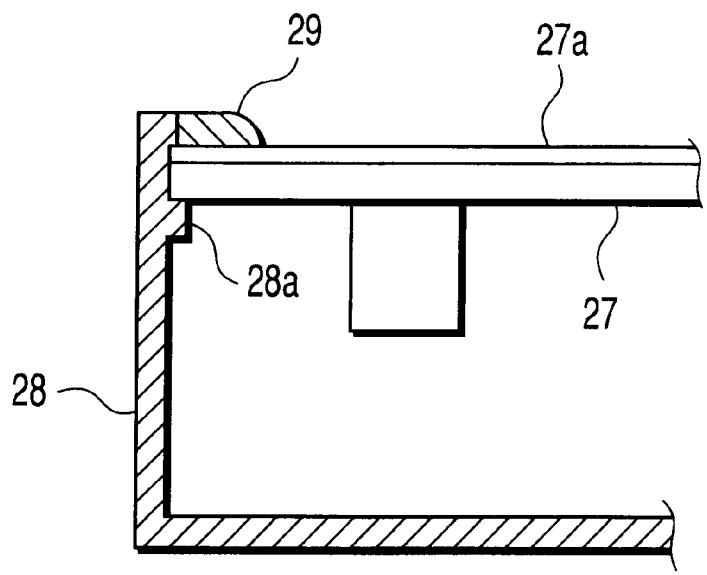
FIG. 6 is a cross-sectional side view illustrating the relationship between a printed circuit board and a shield case in the embodiment shown in FIGS. 5A and 5B.

In this case, as shown in FIG. 6, hold portions 28a for holding peripheral edges of the printed circuit board 27 are formed on the shield case 28. The shield case 28 is originally formed such that four side surfaces extend from the flat surface that faces the printed circuit board 27.

In assembly, the four side surfaces of shield case 28 are bent up from the flat surface thereof, thereby enabling the hold portions 28a to hold the printed circuit board 27.

Thereafter, the ground pattern 27a of printed circuit board 27 and the shield case 28 are coupled by the solder portions 29.

According to this other embodiment, the ground pattern 27a serves as a shield cover. Thus, the shield case 12 and ground pattern 27a are constantly put in contact, and there is no possibility of loose contact. Therefore, the problem in the prior art can perfectly be solved.

The present invention is not limited to the above-described embodiments, and various modifications may be made without departing from the spirit of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A radio-frequency apparatus comprising:
    a shield case in which a printed circuit board provided with a radio-frequency circuit is attached;
    a shield cover attached to the shield case such that the shield cover covers a predetermined area of the printed circuit board; and
    a holding mechanism having a resilient engaging portion formed at a peripheral edge portion of the shield cover and first and second projections formed on a side surface of the shield case, and configured to hold the shield cover on the shield case in a state that a predetermined distance is kept between the shield cover and the shield case by holding the resilient engaging portion by the first and second projections.

2. The radio-frequency apparatus according to claim 1, wherein the first projection prevents removal of the shield cover, and the second projection prevents sinking of the shield cover.

3. The radio-frequency apparatus according to claim 1, wherein a plurality of the first projections and the plurality of the second projections are formed on side surfaces of the shield case in an aligned manner.

4. The radio-frequency apparatus according to claim 1, wherein the first and second projections are arranged in a staggered fashion in a direction of coupling of the resilient engaging portions.

5. The radio-frequency apparatus according to claim 1, further comprising:
    a contact portion for grounding, which is formed in the shield case; and
    a propping projection formed at a portion of the shield cover, which is opposed to the shield cover,
    wherein the propping projection is put in pressure-contact with the contact portion when the shield cover is coupled to the shield case.

6. A radio-frequency apparatus comprising:
    a shield case in which a printed circuit board provided with a radio-frequency circuit is attached;
    a shield cover attached to the shield case such that the shield cover covers a predetermined area of the printed circuit board;
    a holding mechanism having a resilient engaging portion formed at a peripheral edge portion of the shield cover and first and second projections formed on a side surface of the shield case, and configured to hold the shield cover on the shield case in a state that a predetermined distance is kept between the shield cover and the shield case by holding the resilient engaging portion by the first and second projections; and
    a mechanism having a contact portion for grounding, which is formed in the shield case and a propping projection formed at a portion of the shield cover, which is opposed to the contact portion, the mechanism being configured such that the propping projection is put in pressure-contact with the contact portion in a state that the shield cover is coupled to the shield case by the holding mechanism.

7. The radio-frequency apparatus according to claim 6, wherein the first projection prevents removal of the shield cover, and the second projection prevents sinking of the shield cover.

8. The radio-frequency apparatus according to claim 6, wherein a plurality of the first projections and the plurality of the second projections are formed on side surfaces of the shield case in an aligned manner.

9. The radio-frequency apparatus according to claim 6, wherein the first and second projections are arranged in a staggered fashion in a direction of coupling of the resilient engaging portions.

10. A radio-frequency apparatus comprising:
    a shield case in which a printed circuit board provided with a radio-frequency circuit is attached;
    a shield cover attached to the shield case such that the shield cover covers a predetermined area of the printed circuit board; and
    a holding mechanism having a resilient engaging portion formed at a peripheral edge portion of the shield cover and first and second projections formed on a side surface of the shield case, and configured to hold the shield cover on the shield case in a state that a predetermined distance is kept between the shield cover and the shield case by holding the resilient engaging portion by the first and second projections;

wherein the first and second projections are arranged in a staggered fashion in a direction of coupling of the resilient engaging portions.

11. The radio-frequency apparatus according to claim 10, wherein the first projection prevents removal of the shield cover, and the second projection prevents sinking of the shield cover.

12. The radio-frequency apparatus according to claim 10, wherein a plurality of the first projections and the plurality of the second projections are formed on side surfaces of the shield case in an aligned manner.

13. The radio-frequency apparatus according to claim 10, further comprising:

a contact portion for grounding, which is formed in the shield case; and a propping projection formed at a portion of the shield cover, which is opposed to the shield cover, wherein the propping projection is put in pressure-contact with the contact portion when the shield cover is coupled to the shield case.

* * * * *